US009524761B2

United States Patent
Lee et al.

(10) Patent No.: US 9,524,761 B2
(45) Date of Patent: Dec. 20, 2016

(54) SEMICONDUCTOR DEVICE INCLUDING LATCH CONTROLLER FOR PREVENTING DC CURRENT FROM FLOWING BETWEEN DIFFERENTIAL SIGNALS AND METHOD OF OPERATING SAME

(71) Applicant: SAMSUNG ELECTRONICS CO., LTD., Suwon-Si, Gyeonggi-Do (KR)

(72) Inventors: Won Young Lee, Seongnam-Si (KR); Yongcheol Bae, Yongin-Si (KR); Junghwan Choi, Hwaseong-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/731,787

(22) Filed: Jun. 5, 2015

(65) Prior Publication Data

US 2016/0118090 A1 Apr. 28, 2016

(30) Foreign Application Priority Data

Oct. 28, 2014 (KR) ........................ 10-2014-0147698

(51) Int. Cl.
| | | |
|---|---|---|
| G11C 7/10 | (2006.01) | |
| G11C 7/06 | (2006.01) | |
| G11C 7/00 | (2006.01) | |
| G11C 7/02 | (2006.01) | |

(52) U.S. Cl.
CPC ........... *G11C 7/1087* (2013.01); *G11C 7/1084* (2013.01)

(58) Field of Classification Search
USPC ...... 365/189.05, 189.07, 193, 205, 207, 208
See application file for complete search history.

(56) References Cited

U.S. PATENT DOCUMENTS

| | | | |
|---|---|---|---|
| 6,433,600 B2 | 8/2002 | Ilkbahar | |
| 6,791,888 B2 * | 9/2004 | Kang | .................. G11C 7/1051 365/189.05 |
| 7,230,466 B2 | 6/2007 | Park | |
| 7,889,580 B2 | 2/2011 | Millar et al. | |
| 8,023,342 B2 * | 9/2011 | Venkataraman | .... G06F 13/1689 365/193 |
| 8,086,813 B2 | 12/2011 | Gillingham et al. | |
| 8,406,080 B2 * | 3/2013 | Byun | .................. G11C 7/1051 365/189.05 |
| 8,456,924 B2 | 6/2013 | Song | |

(Continued)

FOREIGN PATENT DOCUMENTS

JP 2012-205041 A 10/2012

*Primary Examiner* — Trong Phan
(74) *Attorney, Agent, or Firm* — Volentine & Whitt, PLLC

(57) ABSTRACT

Provided is a semiconductor device to prevent DC current from flowing between differential input signals. The semiconductor device includes a first input unit configured to buffer a first signal of differential input signals, a second input configured to buffer a second signal of the differential input signals, and a latch coupled between a first repeating node of the first input unit and a second repeating node of the second input unit to prevent duty variation of the first and second signals. The semiconductor device further includes a latch controller configured to selectively switch the operation of the latch based on states of the first and second signals appearing at the first and second repeating nodes during a time interval before preambles of the differential input signals are received.

20 Claims, 15 Drawing Sheets

(56) References Cited

U.S. PATENT DOCUMENTS

| 8,644,085 B2* | 2/2014 | Kim ................... H03K 5/1565 |
| | | 365/189.05 |
| 2012/0026806 A1 | 2/2012 | Kwon |
| 2013/0010546 A1 | 1/2013 | Wang et al. |
| 2013/0070536 A1 | 3/2013 | Takai |

* cited by examiner

SEMICONDUCTOR DEVICE INCLUDING LATCH CONTROLLER FOR PREVENTING DC CURRENT FROM FLOWING BETWEEN DIFFERENTIAL SIGNALS AND METHOD OF OPERATING SAME

CROSS-REFERENCE TO RELATED APPLICATIONS

This US non-provisional patent application claims priority under 35 USC §119 to Korean Patent Application No. 10-2014-0147698, filed on Oct. 28, 2014, the disclosure of which is incorporated by reference in its entirety herein.

BACKGROUND

Technical Field

Embodiments of the present disclosure relate to semiconductor devices and, more particularly, to a semiconductor device to prevent DC current from flowing between differential signals.

Discussion of Related Art

A data processing system including a processor may be used with a working memory of a nonvolatile memory device such as a dynamic random access memory (hereinafter referred to as "DRAM").

A DRAM includes a plurality of memory cells each including a single access transistor and a single storage capacitor. A memory cell is connected to a bitline and a wordline to be accessed during a read operation and a write operation.

A need for signal integrity performance is increasing as operating frequency and density of a DRAM increases. In order to improve the signal integrity performance, differential signaling of a data strobe signal in a chip may be applied.

An inverter latch which prevents duty variation to achieve signal integrity when differential input signals are repeated in a chip may be applied to a buffer circuit of a semiconductor device.

SUMMARY

The present disclosure describes a semiconductor device that prevents DC current from flowing between differential signals.

Embodiments of the application provide a semiconductor device. The semiconductor device may include a first input unit configured to buffer a first signal of differential input signals; a second input unit configured to buffer a second signal of the differential input signals; a latch coupled between a first repeating node of the first input unit and a second repeating node of the second input unit to prevent duty variation of the first and second signals; and a latch controller configured to selectively switch an operation of the latch based on states of the first and second signals appearing at the first and second repeating nodes during a time interval before preambles of the differential input signals are received.

In example embodiments, a phase of the first signal and a phase of the second signal may be opposite to each other.

In example embodiments, the second signal may be a complementary data strobe signal when the first signal is a data strobe signal.

In example embodiments, the first input unit may include a first differential amplifying unit configured to perform differential amplification to output a first buffering signal to the first repeating node by receiving the first signal at a non-inverting terminal and receiving the second signal at an inverting terminal and a first inverting unit configured to lift the first buffering signal. The second input unit may include a second differential amplifying unit configured to perform differential amplification to output a second buffering signal to the second repeating node by receiving the second signal at a non-inverting terminal and receiving the first signal at an inverting terminal and a second inverting unit configured to lift the second buffering signal.

In example embodiments, the latch may be a cross-coupled inverter latch having an on/off switch terminal.

In example embodiments, the latch controller may switch off the latch to disable a latch operation when phases of the first and second signals are identical to each other.

In example embodiments, the latch controller may switch on the latch to enable a latch operation when phases of the first and second signals are different from each other.

In example embodiments, the latch controller may include a phase comparison unit configured to compare phases of the first and second signals appearing at the first and second repeating nodes; and a control signal generation unit configured to control a latch switching control signal in response to a result of the phase comparison.

In example embodiments, the phase comparison unit may include a plurality of inverters and NOR gates.

In example embodiments, the semiconductor device may be a low-power double data rate DRAM.

Embodiments of the application provide a semiconductor device including a buffer circuit. The buffer circuit may include a first input unit configured to buffer a data strobe signal applied through a first pad; a second input unit configured to buffer a complementary data strobe signal applied through a second pad; a cross-coupled inverter latch coupled between a first repeating node of the first input unit and a second repeating node of the second input unit; and a latch controller configured to compare a phase of the data strobe signal appearing at the first repeating node with a phase of the complementary data strobe signal appearing at the second repeating node to generate a switching control signal for selectively switching the operation of the cross-coupled inverter latch.

In example embodiments, the cross-coupled inverter latch may be activated to a switch-on state after a preamble interval of the data strobe signal and the complementary strobe signal.

In example embodiments, the first input unit may include a first differential amplifying unit configured to perform differential amplification to output a first buffering signal to the first repeating node by receiving the data strobe signal at a non-inverting terminal and receiving the complementary data strobe signal at an inverting terminal and a first inverting unit configured to lift the first buffering signal. The second input unit may include a second differential amplifying unit configured to perform differential amplification to output a second buffering signal to the second repeating node by receiving the complementary data strobe signal at a non-inverting terminal and receiving the data strobe signal at an inverting terminal and a second inverting unit configured to lift the second buffering signal.

In example embodiments, the cross-coupled inverter latch may have an on/off switch terminal to receive the switch control signal.

In example embodiments, the latch controller may generate the switching control signal to switch off the cross-coupled inverter latch when phases of the data strobe signal and the complementary data strobe signal are identical to each other.

Embodiments of the application provide an operating method of a buffer circuit of a semiconductor device. The operating method may include mounting an inverter latch between repeating nodes for signal integrity of differential input signals applied through input pads; comparing phases of the differential input signals with each other; and selectively switching the inverter latch according to a result of the phase comparison.

In example embodiments, selectively switching the inverter latch may include disabling the inverter latch when phases of the differential input signals are identical to each other; and enabling the inverter latch when the phases of the differential input signal are different from each other.

In example embodiments, the differential input signals may be a data strobe signal and a complementary data strobe signal having a phase opposite to that of the data strobe signal.

In example embodiments, the differential input signals may be applied from a memory controller.

In example embodiments, comparing phases of the differential input signals may be performed to prevent DC current from flowing between the differential input signals during an unknown interval before preambles of the differential input signals are applied.

Embodiments of the application provide a semiconductor device having a latch that aligns duty cycles of first and second signals having opposite phases. A buffer receives the duty-cycle-aligned first and second signals and generates first and second buffered signals, having opposite phases, from the duty-cycle-aligned first and second signals. A latch controller disables the duty cycle alignment operation of the latch while the first and second signals do not have opposite phases.

In example embodiments, the first and second buffered signals are a differential pair of output signals.

In example embodiments, a differential amplifying device generates the first and second signals from received signals.

In example embodiments, the buffer generates intermediary first and second signals, having opposite phases, from the duty-cycle-aligned first and second signals. Another latch aligns duty cycles of the first and second intermediary signals, and the buffer generates the first and second buffered signals from the duty-cycle-aligned first and second intermediary signals.

In example embodiments, the latch controller disables the alignment operation of the other latch while the first and second intermediary signals do not have opposite phases.

Embodiments of the application provide a method, executed by a semiconductor device, of buffering opposite-phase signals. The method includes aligning duty cycles of first and second signals having opposite phases, buffering first and second buffered signals, having opposite phases, that are generated from the duty-cycle-aligned first and second signals, and disabling the duty-cycle-alignment operation of the first and second signals while the first and second signals do not have opposite phases.

In example embodiments, the first and second buffered signals are a differential pair of output signals.

In example embodiments, received signals are differentially amplified to generate the first and second signals.

In example embodiments, intermediary first and second signals, having opposite phases, are generated from the duty-cycle-aligned first and second signals. The duty cycles of the first and second intermediary signals are aligned, and the first and second buffered signals are generated from the duty-cycle-aligned first and second intermediary signals.

In example embodiments, the duty-cycle-alignment operation of the first and second intermediary signals is disabled while the first and second intermediary signals do not have opposite phases.

According to embodiments of the application, current constant flow between differential signals is prevented or minimized during an unknown interval of a differential signal to reduce power consumed when the differential is used.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain principles of the disclosure. In the drawings.

DETAILED DESCRIPTION

Figure 1:
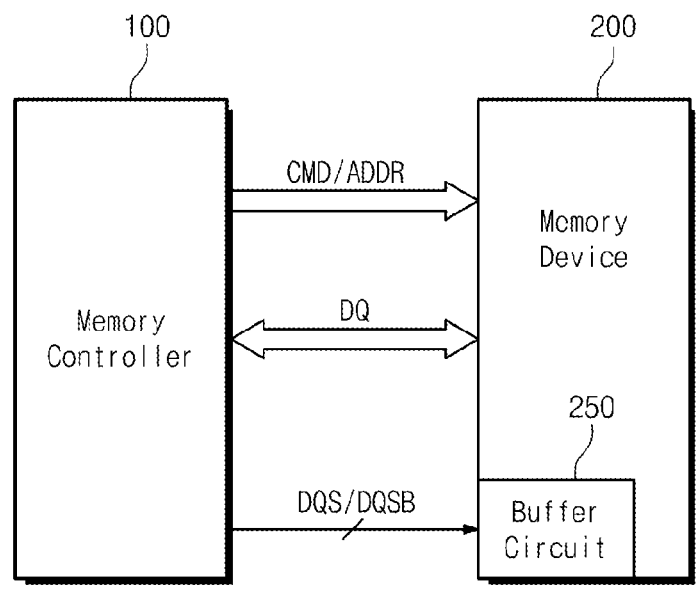
FIG. 1 is an exemplary block diagram of a memory system applied to the application.

Example embodiments of the present disclosure will now be described more fully through the following exemplary embodiments related to the accompanying drawings. However, the disclosure is not limited to the following embodiments but may be embodied in other forms.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements. Other words used to describe relationships between elements should be interpreted in a like fashion (i.e., "between" versus "directly between," "adjacent" versus "directly adjacent," etc.).

Moreover, the same or like reference numerals in each of the drawings represent the same or like components if possible. In some drawings, the connection of elements and lines is just represented to effectively explain technical content and may further include other elements or circuit blocks.

Note that each embodiment that is herein explained and exemplified may also include its complementary embodiment. The details of basic data access operations to a DRAM or a memory module and internal functional circuits and the details of a module structure and a structure or shape of a module tab area are not described so as not to make the subject matter of the disclosure ambiguous.

FIG. 1 is an exemplary block diagram of a memory system applied to the application. As illustrated, the memory system includes a memory controller 100 and a memory device 200 as a semiconductor device. The memory device 200 includes a buffer circuit 250 to receive and buffer a data strobe signal (hereinafter referred to as "DQS") and a complementary strobe signal (hereinafter referred to as "DQSB").

The memory controller 100 may apply a command and an address through a command/address bus CMD/ADDR to control the memory device 200. The memory controller 100 may receive read data from the memory device 200 through a data bus DQ or provide write data to the memory device 200 through the data bus DQ.

The DQS and the DQSB are data strobe signals which are provided for data output strobe and whose phases are opposite to each other. That is, the memory controller 100 provides the DQS and the DQSB in the form of differential signals. For the convenience of description, the DQS will be frequently referred to as a first signal of differential input signals and the DQSB will be frequently referred to as a second signal of the differential input signals. However, this is merely exemplary and the DQS may be a second signal when the DQSB is a first signal.

The memory device 200 may be a DDR-type DRAM. When the memory device 200 is applied to a mobile DRAM, it may be an LPDDR or Wide I/O DRAM.

An LPDDR4 DRAM may process data of 12.8 gigabytes (GB) per second in 32 I/Os at a speed of 3200 Mbps, while a Wide I/O DRAM may process data of 51.2 GB per second in 512 I/Os despite a lower operating speed (800 Mbps) for a single I/O than that of the LPDDR4 DRAM. Thus, the processing speed per second of the Wide I/O DRAM is four times higher than that of the LPDDR4 DRAM.

Figure 2:
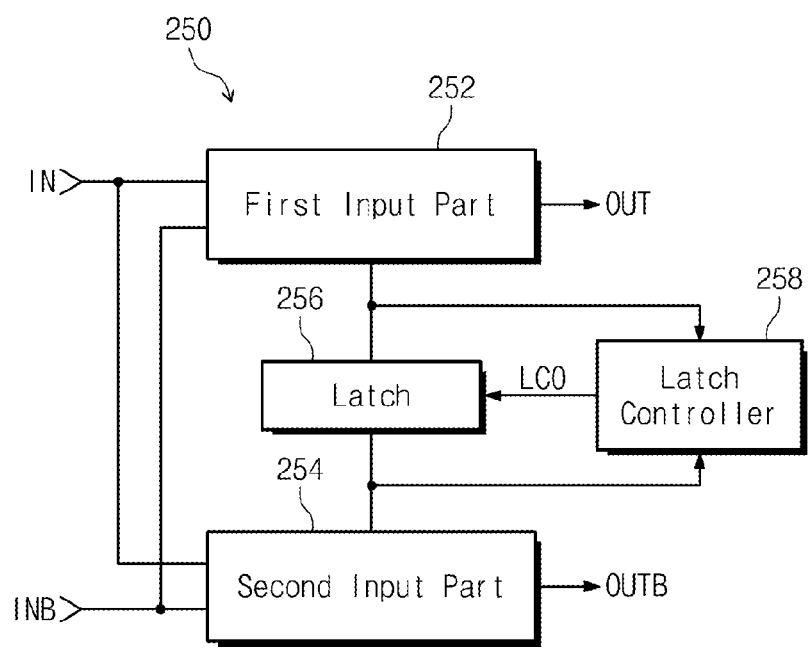
FIG. 2 is an exemplary block configuration diagram of a buffer circuit in FIG. 1.

FIG. 2 is an exemplary block configuration diagram of the buffer circuit 250 in FIG. 1. As illustrated, the buffer circuit 250 includes a first input unit 252, a second input unit 254, a latch 256, and a latch controller 258.

The first input unit 252 buffers a first input signal IN of differential input signals IN and INB. A buffering result of the first signal IN is output as a first output signal OUT.

The second input unit 254 buffers a second signal INB of the differential input signals IN and INB. A buffering result of the second signal is output as a second output signal OUTB.

The latch 256 is coupled between a first repeating node of the first input unit 252 and a second repeating node of the second input unit 254 to prevent duty variation for signal integrity of the first and second signals IN and INB. The first repeating node means a connection node between an input and an output of the first input unit 252, and the second repeating node means a connection node between an input and an output of the second input unit 254.

The latch controller 258 generates a latch switching control signal LCO to selectively switch the operation of the latch 256 based on states of the first and second signals IN and INB.

Thus, DC current which may flow through the latch 256 is cut off when the first and second signals IN and INB are in an unknown state before preambles of the first and second signals IN and INB are received. The first and second signals IN and INB may be normally received as differential input signals after a preamble interval. As a result, during a time interval before the preambles of the first and second signals IN and INB are received, the first and second signals IN and INB may be in the unknown state in which their phases are identical to each other or different from each other. Since DC current flows through the latch 256 when the phases of the first and second signals IN and INB are identical to each other in the unknown state, the latch controller 258 switches off the latch 256.

Figure 3:
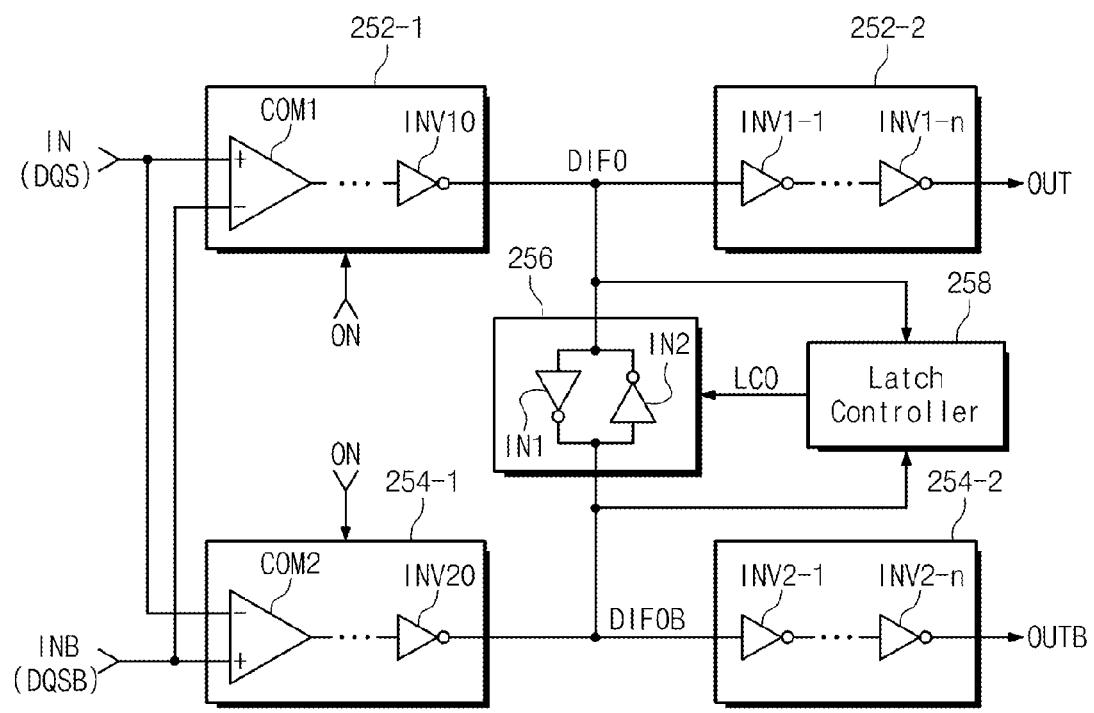
FIG. 3 is an exemplary circuit diagram according to the embodiment of FIG. 2.

FIG. 3 is an exemplary circuit diagram according to the embodiment of FIG. 2. As illustrated, the first input unit 252 in FIG. 2 may include a first differential amplifying unit 252-1 and a first inverting unit 252-2, and the second input unit 254 may include a second differential amplifying unit 254-1 and a second inverting unit 254-2.

When the first signal IN is DQS, the second signal INB may be a complementary signal DQSB of the DQS.

The latch 256 may be a cross-coupled inverter latch having an on/off switch terminal The latch 256 may include two inverters IN1 and IN2.

The latch controller 258 selectively switches the operation of the latch 256 based on states of the first and second signals DQS and DQSB appearing at the first and second repeating nodes during a time interval before the preambles of the differential input signals DQS and DQSB.

In the first input unit 252, the first differential amplifying unit 252-1 receives the first signal IN at a non-inverting terminal (+) and receives the second signal INB at an inverting terminal (−) to perform differential amplification to output a first buffering signal DIFO at the first repeating node. The first differential amplifying unit 252-1 may include a differential inverter COM1 and an inverter INV10. The first inverting unit 252-2 includes a plurality of inverters INV1-1 to INV1-$n$ to lift the first buffering signal DIFO. In FIG. 3, the first repeating node is a node at which the first buffering signal DIFO appears.

In the second input unit 254, the second differential amplifying unit 254-1 receives the second signal INB at a non-inverting terminal (+) and receives the first signal IN at an inverting terminal (−) to perform differential amplification to output a second buffering signal DIFOB at the second repeating node. The second differential amplifying unit 254-1 may include a differential amplifier COM2 and an inverter INV20. The second inverting unit 254-2 includes a plurality of inverters INV2-1 to INV2-$n$ to lift the second buffering signal DIFOB. In FIG. 3, the second repeating node is a node at which the second buffering signal DIFOB appears.

The latch controller 258 generates a latch switching control signal LCO to switch off the latch 256 when the phases of the first and second signals DQS and DQSB are identical to each other. Thus, the operation of the latch 256 is disabled.

The latch controller 258 generates a latch switching control signal LCO to switch on the latch 256 when the phases of the first and second signals DQS and DQSB are different from each other. Thus, the operation of the latch 256 is enabled.

As a result, the first and second signals DQS and DQSB go to the unknown state during the time interval before the preambles of the first and second signals DQS and DQSB are applied. In this case, when the latch 256 is switched on, DC current may flow between the first and second signals DQS and DQSB that are differential signals. That is, a DC current path is formed between a ground and the first repeating node at which the first buffering signal DIFO appears and between a ground and the second repeating node at which the second buffering signal DIFOB appears. Thus, a switch-on operation of the latch 256 is selectively controlled to prevent the DC current from flowing during the time interval before the preambles of the first and second signals DQS and DQSB are applied. The latch controller 258 may have an exemplary configuration as shown in FIG. 4.

Figure 4:
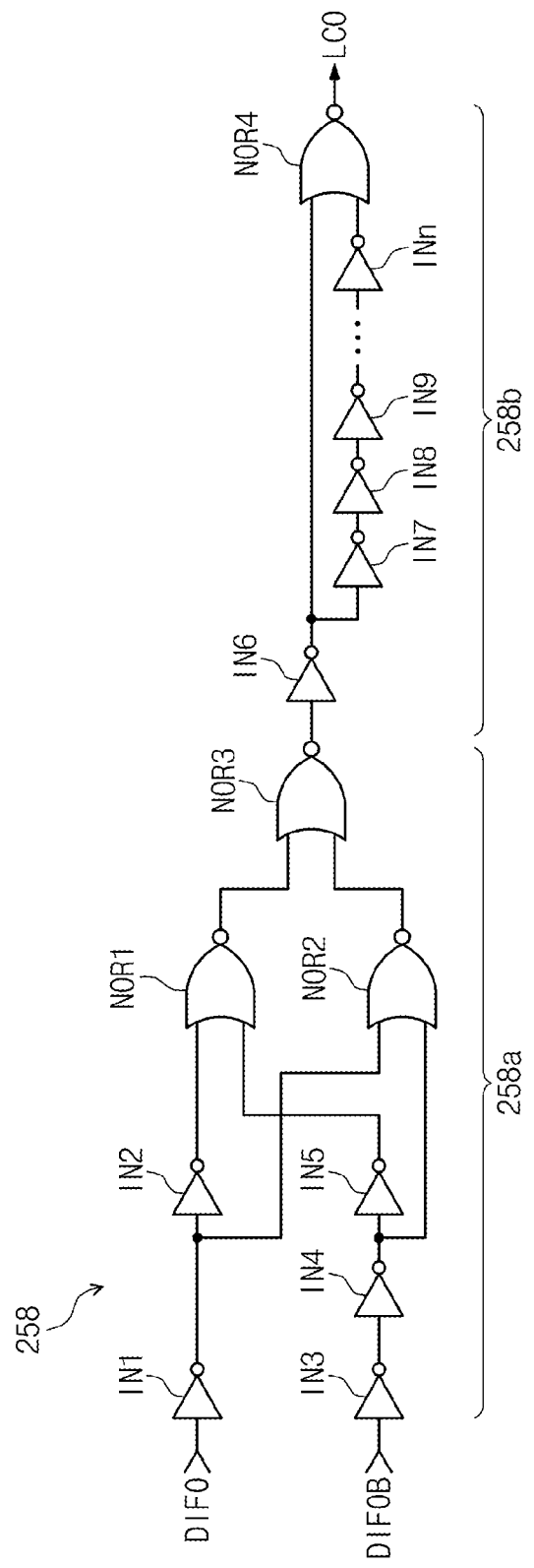
FIG. 4 is an exemplary detailed circuit diagram of a latch controller in FIG. 3.

FIG. 4 is an exemplary detailed circuit diagram of the latch controller 258 in FIG. 3. As illustrated, the latch controller 258 includes a phase comparison unit 258a to compare phases of the first and second signals DQS and DQSB appearing at the first and second repeating nodes and a control signal generation unit 258b to generate a latch switching control signal LCO in response to a result of the phase comparison.

The phase comparison unit 258a may include a plurality of inverters IN1, IN2, IN3, IN4, and IN5 and NOR gates NOR1, NOR2, and NOR3. The phase comparison unit 258a may output a logic high through the NOR gate NOR3 when a phase of a first buffering signal DIFO and a phase of a second buffering signal DIFOB are identical to each other.

The phase comparison unit 258a may output a logic low through the NOR gate NOR3 when the phase of the first buffering signal DIFO and the phase of the second buffering signal DIFOB are different from each other.

The control signal generation unit 258b may include a plurality of inverters INV6 to INVn and a NOR gate NOR4. The control signal generation unit 258b may output a logic-high latch switching control signal LCO through the NOR gate NOR4 when an output of the NOR gate NOR3 is logic high. The control signal generation unit 258b may output a logic-low latch switching control signal LCO through the NOR gate NOR4 when an output of the NOR gate NOR3 is logic low.

Figure 5:
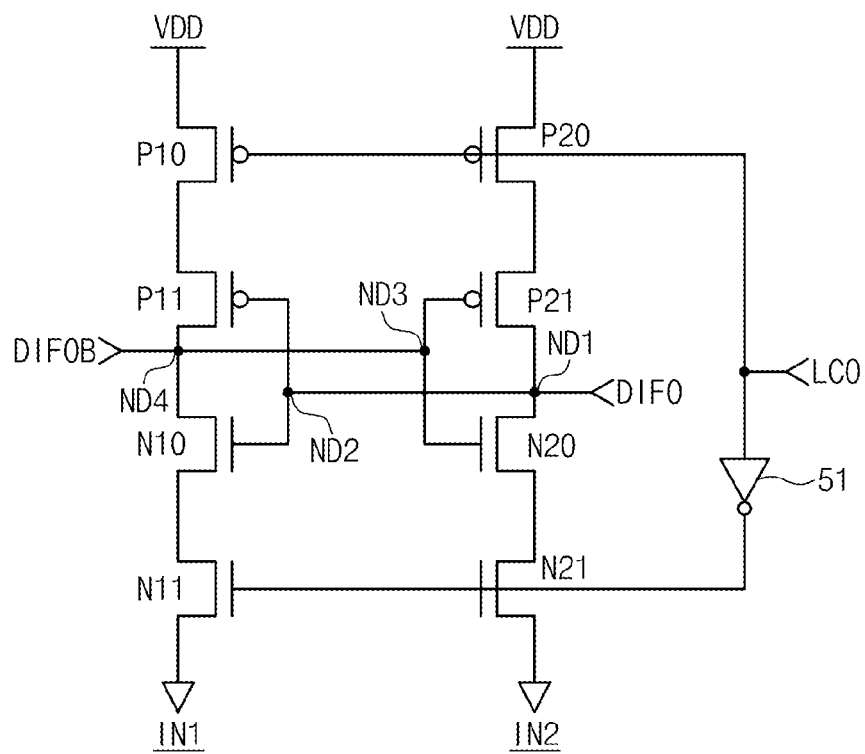
FIG. 5 is an exemplary detailed circuit diagram of a latch in FIG. 3.

FIG. 5 is an exemplary detailed circuit diagram of the latch 256 in FIG. 3. As illustrated, a first inverter IN1 may include PMOS transistors P10 and P11 and NMOS transistors N10 and N11. A second inverter IN2 may include PMOS transistors P20 and P21 and NMOS transistors N20 and N21.

The PMOS transistors P11 and P21 and the NMOS transistors N10 and N20 constitute a cross-coupled inverter latch having first through fourth nodes ND1, ND2, ND3 and ND4, and the PMOS transistors P10 and P20 and the NMOS transistors N11 and N21 serve as a switch switched in response to the latch switching control signal LCO. In FIG. 5, the inverter 51 may an element for inverting a control signal.

The latch switching control signal LCO may be applied as logic high when the phase of the first buffering signal DIFO and the phase of the second buffering signal DIFOB are identical to each other.

When the latch switching control signal LCO is provided as logic high, the PMOS transistors P10 and P20 and the NMOS transistors N11 and N21 are turned off. Thus, the operation of the cross-coupled inverter latch is disabled.

Meanwhile, the latch switching control signal LCO may be applied with logic low when the phase of the first buffering signal DIFO and the phase of the second buffering signal DIFOB are different from each other.

When the latch 256 is provided with a logic low latch switching control signal LCO, the latch is enabled. While enabled, the latch 256 causes a logic low signal to exist on the DIFOB signal line when a logic high signal is received on the DIFO signal line and causes a logic high signal to exist on the DIFOB signal line when a logic low signal is received on the DIFO signal line. Similarly, while enabled, the latch 256 causes a logic low signal to exist on the DIFO signal line when a logic high signal is received on the DIFOB signal line and causes a logic high signal to exist on the DIFO signal line when a logic low signal is received on the DIFOB signal line. In this way, the latch 256 reduces a duty variation of the signals appearing on the DIFO and DIFOB signal lines and, thereby, reduces a duty variation of the differential signals buffered by first inverting unit 252-2 and second inverting unit 254-2.

When the latch switching control signal LCO is provided as a logic-low signal, the PMOS transistors P10 and P20 and the NMOS transistors N11 and N21 are turned on. Thus, the operation of the cross-coupled inverter latch is enabled.

Figure 7:
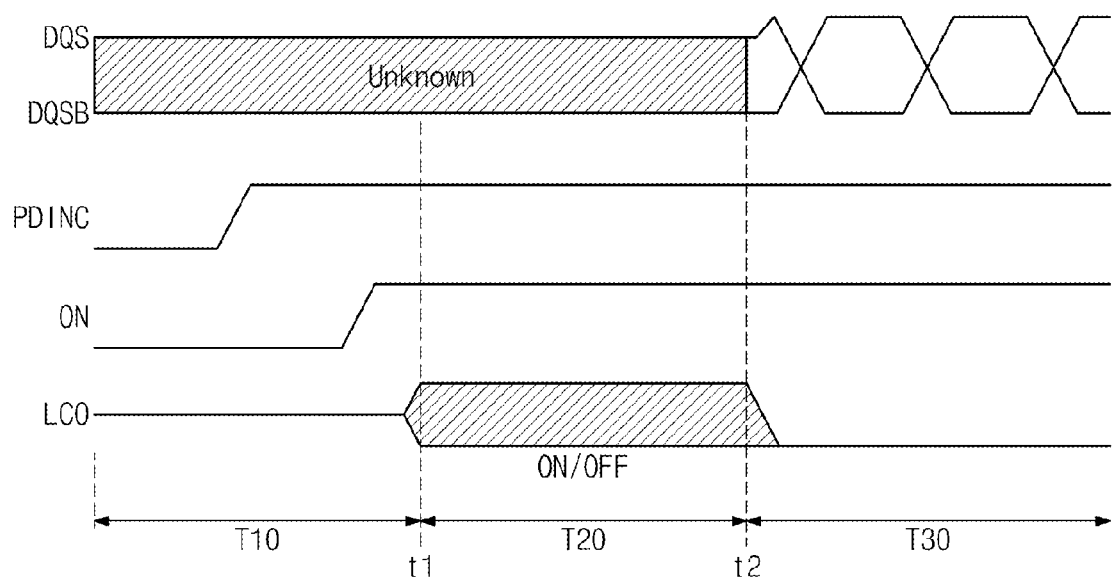
FIG. 7 is a timing diagram of a latch control operation according to FIG. 3.

FIG. 7 is a timing diagram of a latch control operation according to FIG. 3. In FIG. 7, a horizontal axis represents a time and a vertical axis represents a voltage level.

During a time interval T20 between a time point t1 and a time point t2, a latch operation of the latch 256 is switched on or switched off. The latch switching control signal LCO may be provided as a logic-high signal or a logic-low signal, as indicated by an LCO waveform. When phases of first and second signals DQS and DQSB are identical to each other during the time interval T20, the latch operation of the latch 256 is switched off to prevent DC current from flowing between differential signals.

During a time interval T30 following the time point t2, preambles of the first and second signals DQS and DQSB are applied. Since the first and second signals DQS and DQSB are received in the form of normal differential signals during the time interval T30, the latch switching control signal LCO is provided as a logic-low signal. Since the phase of the first and second signals DQS and DQSB are opposite to each other during the time interval T30, the latch operation of the latch 256 is switched on.

If the latch switching control signal LCO is not provided during a time interval T10 before the time point t1, a waveform PDINC (pi data input command) and a waveform ON are activated as a logic-high level.

The waveform PDINC is a signal generated using a write command, and the waveform ON is a signal generated to enable differential amplifiers COM1 and COM2 in FIG. 3 and is a delayed version of the waveform PDINC.

The unknown interval in which logic states of the first and second signals DQS and DQSB cannot be known includes the time intervals T10 and T20, and the latch 256 is switched on or switched off in the time interval T20. DC current flowing through the latch 256 is cut off when the latch 256 is switched off.

Figure 6:
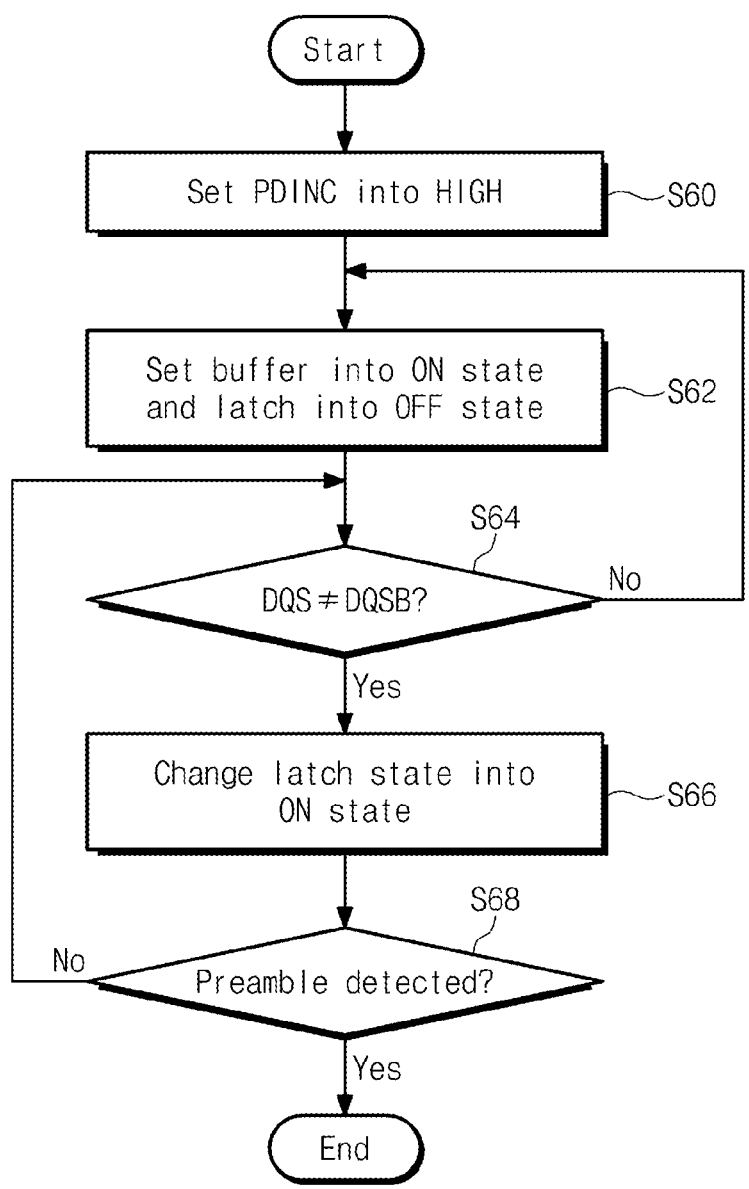
FIG. 6 is a flowchart summarizing a latch control operation according to the application.

FIG. 6 is a flowchart summarizing a latch control operation according to the application. Referring to FIG. 6, the latch control operation in FIG. 5 includes steps S60, S62, S64, S66, and S68.

According to the description in FIG. 6, the waveform PDINC is activated as a logic-high level in response to a write command (S60).

The first and second differential amplifying units 252-1 and unit 254-1 each functioning as a buffer in FIG. 3 are activated according to the logic high of the waveform ON in FIG. 6 (S62). The latch 256 may be set to a switch-off state or an initial state according to a waveform of the latch switching control signal LCO in FIG. 6.

Phases of the first and second signals DQS and DQSB are compared with each other (S64) by surrogacy through the first and second buffering signals DIFO and DIFOB with each other. More simply, the phases of the first and second signals DQS and DQSB are the same as those of the first and second buffering signals DIFO and DIFOB, respectively.

Since DC current needs to be cut off when the phases of the first and second signals DQS and DQSB are identical to each other, the latch control operation returns to S62 when the phases are identical. In this case, the latch switching control signal LCO is provided as a logic-high signal and thus the latch 256 goes to a switching-off state.

When the phases of the first and second signals DQS and DQSB are different from each other, the latch control operation transitions to S66. The latch switching control signal LCO is provided as a logic-low signal and thus the latch 256 goes to a switching-on state (S66).

When a preamble is detected, the latch control operation is completed and the latch 256 is maintained at the switching-on state (S68).

When the preamble is not detected (S68), the latch control operation returns to S66.

Figure 8:
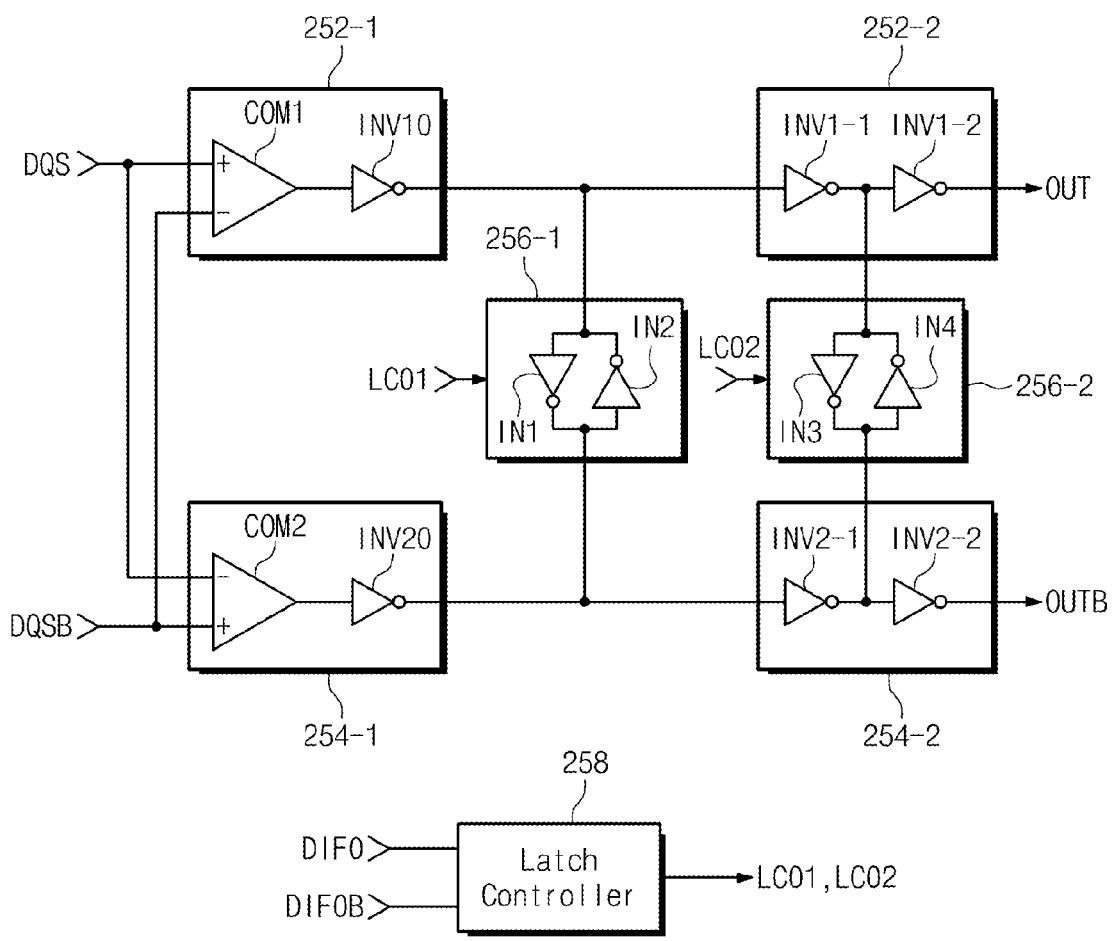
FIG. 8 is another exemplary circuit diagram according to the embodiment of FIG. 2.

FIG. 8 is another exemplary circuit diagram according to the embodiment of FIG. 2. The configuration in FIG. 8 is identical to that in FIG. 3, apart from an addition of a second latch 256-2.

Similar to a first latch 256-1, the second latch 256-2 may be a cross-coupled inverter latch having an on/off switching terminal. The second latch 256-2 may include two inverters IN3 and IN4.

In FIG. 8, a latch controller 258 selectively switches operations of the first and second latches 256-1 and 256-2 based on states of first and second signals DQS and DQSB, received through the surrogacy of first and second buffering signals DIFO and DIFOB, respectively, during a time interval before preambles of the differential input signals DQS and DQSB are received.

The latch controller 258 generates latch switching control signals LCO1 and LCO2 to switch off the first and second latches 256-1 and 256-2 when phases of the first and second signals DQS and DQSB are identical to each other. Thus, the operations of the first and second latches 256-1 and 256-2 are disabled.

The latch controller 258 generates latch switching control signals LCO1 and LCO2 to switch on the first and second latches 256-1 and 256-2 when the phases of the first and second signals DQS and DQSB are different from each other. Thus, the operations of the first and second latches 256-1 and 256-2 are enabled.

In FIG. 8, when two latches are formed between differential signals, the latch controller 258 controls the two latches at one time.

The latch controller 258 in FIG. 8 may have the same configuration as shown in FIG. 4.

Figure 9:
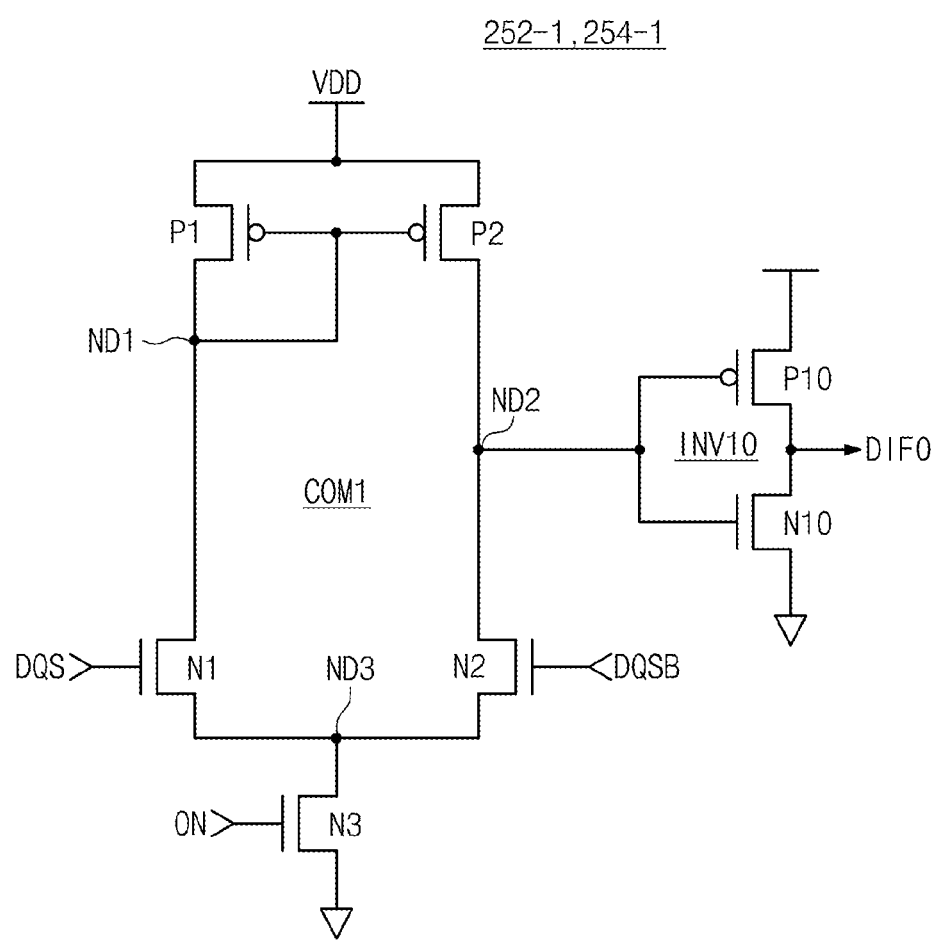
FIG. 9 is an exemplary detailed circuit diagram of an input unit in FIG. 3 or 8.

FIG. 9 is an exemplary detailed circuit diagram of an input unit in FIG. 3 or 8. A first differential amplifying unit 252-1 in the input unit may include, for example, a differential amplifier COM1 and an inverter INV10 as shown in FIG. 3 or 8. Therefore, a circuit configuration corresponding to a single differential amplifier and a single inverter is shown in FIG. 9.

Referring to FIG. 9, a differential amplifier COM1 having first through third nodes ND1, ND2 and ND3, may include PMOS transistor P1 and P2 and NMOS transistors N1, N2, and N3. An inverter INV10 may include a PMOS transistor P10 and an NMOS transistor N10.

The first and second signals DQS and DQSB are applied to the NMOS transistors N1 and N2 of the differential amplifier COM1, respectively. An ON signal is applied to the NMOS transistor N3 of the differential amplifier COM1 as a buffer enable signal.

When a level of the first signal DQS is higher than that of the second signal DQSB, the NMOS transistor N1 is turned on more strongly than the NMOS transistor N2. Thus, as a voltage level of the node ND1 decreases, the PMOS transistor P2 is fully turned on to increase a voltage level of the node ND2. As a result, the voltage level of the first signal DQS is amplified to appear as a buffered signal at the node ND2.

When the first signal DQS is buffered and output as a high-level signal, the inverter INV10 may generate a low-level output as a first buffering signal DIFO.

The circuit shown in FIG. 9 is just an example of a differential amplifier and an inverter, and an internal circuit of the differential amplifier may change variously.

Figure 10:
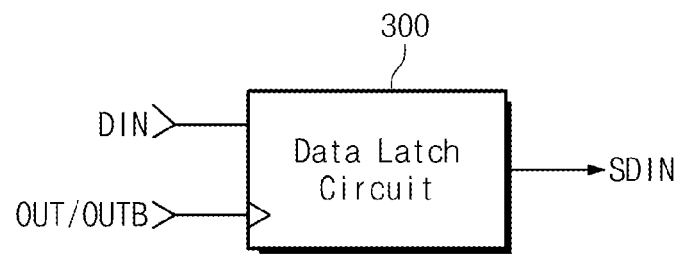
FIG. 10 is a block diagram illustrating an application example of the application applied to a data latch circuit.

FIG. 10 is a block diagram illustrating an example of the application applied to a data latch circuit 300. As illustrated, the data latch circuit 300 may latch input data DIN to output received input data SDIN. In this case, an output of the buffer circuit 250 in FIG. 2 may be applied as a latch signal to perform a latch operation of the data latch circuit 300. The output of the buffer circuit 250 in FIG. 2 is differential output signals OUT/OUTB having opposite phases. In this case, one of the differential output signals OUT/OUTB may be applied to a latch control terminal of the data latch circuit 300.

The data latch circuit 300 in FIG. 10 may function as a data receiver to receive write data.

Figure 11:
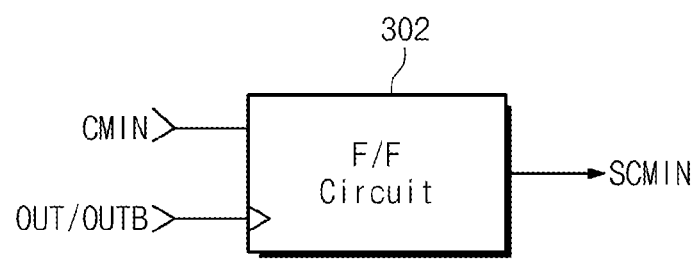
FIG. 11 is a block diagram illustrating an example of the application applied to a flip-flop circuit.

FIG. 11 is a block diagram illustrating an example of the application applied to a flip-flop circuit 302. As illustrated, the flip-flop circuit 302 may latch a command CMIN to output a received command signal SCMIN. In this case, an output of the buffer circuit 250 in FIG. 2 may be applied as a clock signal to perform a circuit operation of the flip-flop circuit 302. The output of the buffer circuit 250 in FIG. 2 is differential output signals OUT/OUTB having opposite phases. In this case, one of the differential output signals OUT/OUTB may be applied to a clock terminal of the flip-flop circuit 302.

The flip-flop circuit 302 in FIG. 11 may function as a command receiver in a semiconductor memory device.

Figure 12:
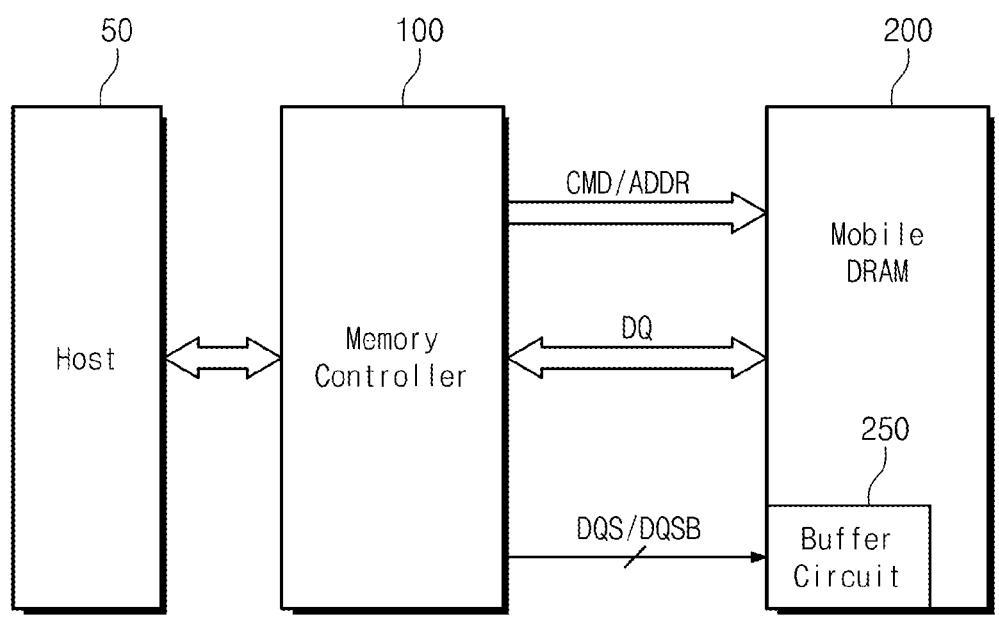
FIG. 12 is a block diagram illustrating an example of the application applied to a mobile device.

FIG. 12 is a block diagram illustrating an example of the application applied to a mobile device. As illustrated, the mobile device includes a host 50, a memory controller 100, and a mobile DRAM 200 including a buffer circuit 250.

The memory controller 100 receives a read command, a write command, and a logic address from the host 50. The memory controller 100 may apply the read command, the write command, and a physical command to the mobile DRAM 200 through a command/address bus CMD/ADDR in response to the control of the host 50.

The memory controller 100 may receive write data from the mobile DRAM 200 through a data bus DQ or provide the write data to the mobile DRAM 200 through the data bus DQ.

The mobile DRAM 200 may include the buffer circuit 250 to receive and buffer signals DQS and DQSB.

During an unknown time interval before preambles of the signals DQS and DQSB are applied, an inverter latch in the buffer circuit 250 is selectively switched off to cut off a DC current path.

Figure 13:
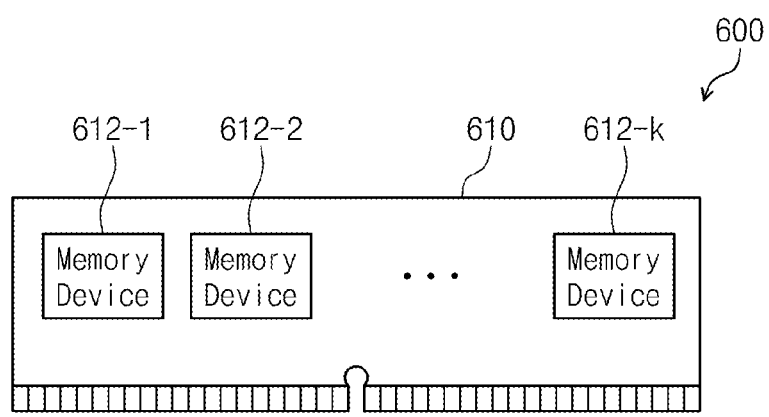
FIG. 13 is a block diagram illustrating an example of the application applied to a memory module.

FIG. 13 is a block diagram illustrating an example of the application applied to a memory module 600. As illustrated, the memory module 600 may include a plurality of memory devices 612-1 to 612-$k$ (k being a positive integer) mounted on a printed circuit board (PCB) 610. The memory module 600 may be a slot 703 mounted on a memory system 900 in FIG. 14. The memory module 600 may have a tab area formed on one surface or both surfaces of the PCB 610 to be electrically connected to a processor 710 or a memory controller in FIG. 14.

The memory devices 612-$l$ to 612-$k$ may be mounted on a support 610, and the structure and operation of each of the memory devices 612-$l$ to 612-$k$ may be substantially identical to those of a DRAM. The memory module 600 may be a single in-line memory module (SIMM), a dual in-line memory module (DIMM), a single in-line pin package memory (SIPP) or a small-outline DIMM (SO-DIMM) according to a mounted form.

Figure 14:
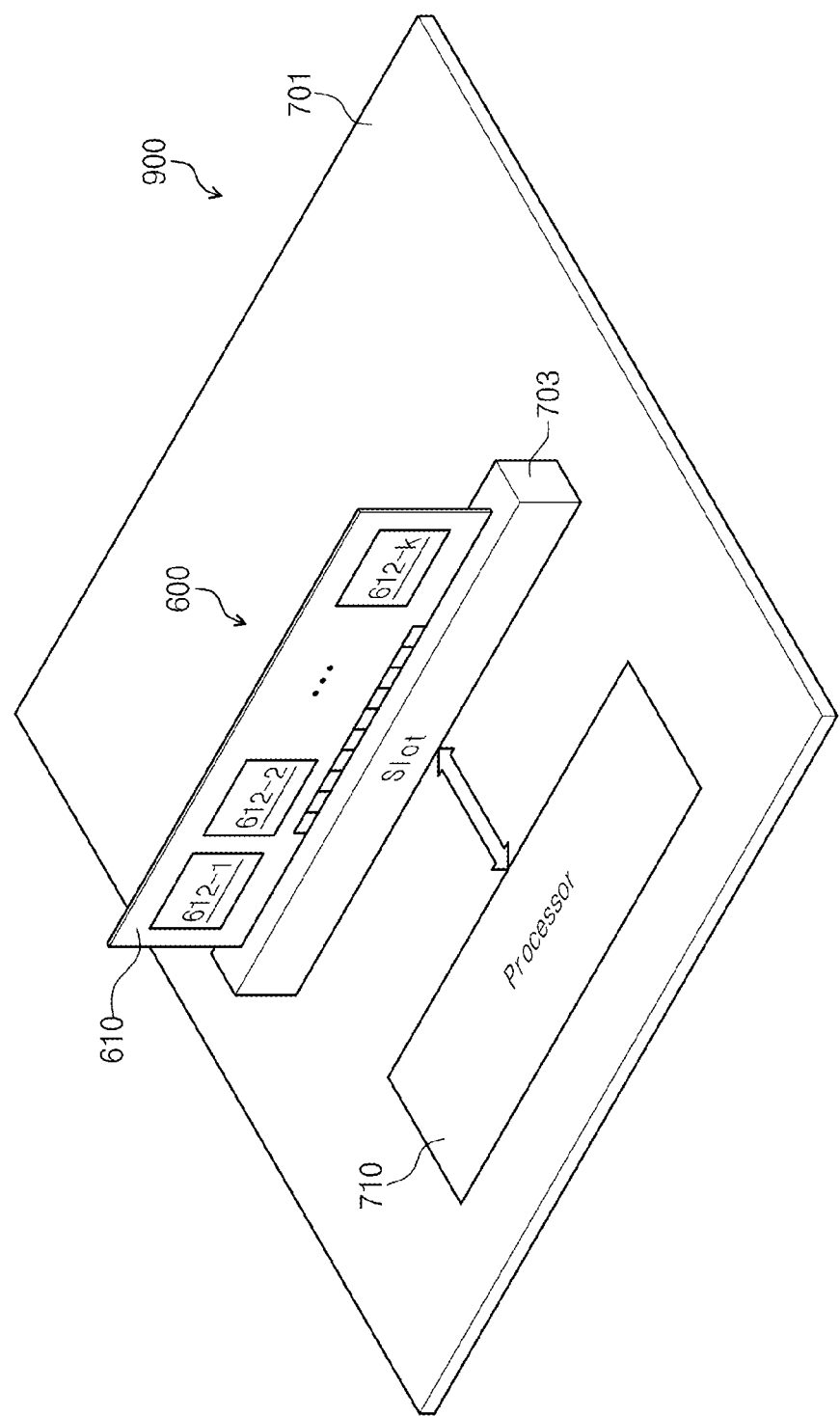
FIG. 14 is a block diagram illustrating an example of the application applied to a memory system on which the memory module of FIG. 13 is mounted.

FIG. 14 is a block diagram illustrating an example of the application applied to a memory system 900 on which FIG. 13 is mounted. The memory system 900 may be applied to a personal computer (PC), a laptop computer or a server. As illustrated, the memory system 900 may include a slot 703 mounted on a main board 701 and a processor 710. Each of memory devices 612-1 to 612-$k$ of the memory module 600 may transmit/receive data to/from the processor 710 through the slot 703 and the main board 701. The processor 710 may be a microprocessor, a field programmable gate array (FPGA) or a chipset.

Since each of the memory devices 612-1 to 612-$k$ may include a buffer circuit to selectively switch off an inverter latch, as described above, the flow of DC current is cut off during an unknown time interval. Thus, operation performance of the memory system 900 may be improved.

Figure 15:
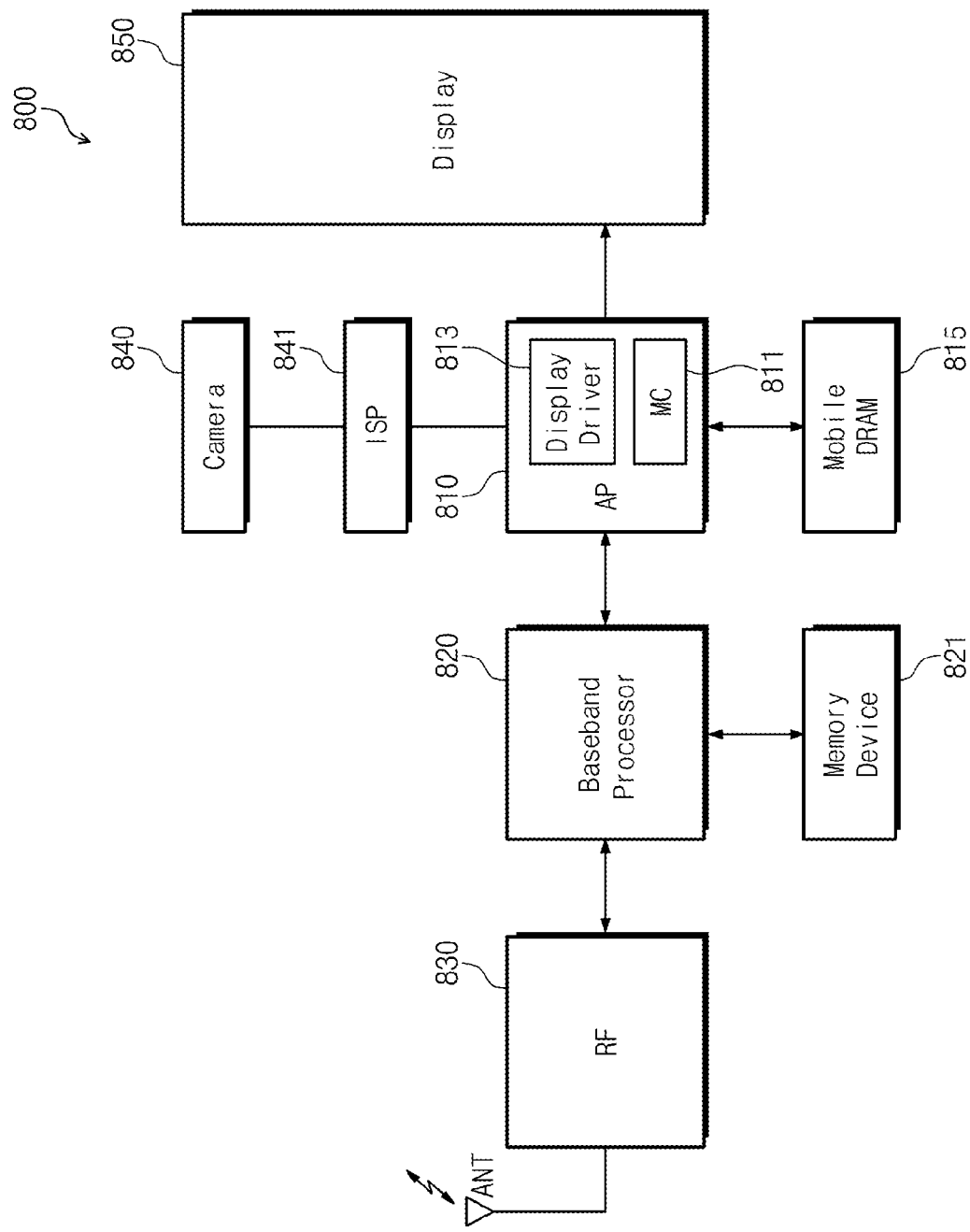
FIG. 15 is a block diagram illustrating an example of the application applied to a smartphone.

FIG. 15 is a block diagram illustrating an example of the application applied to a smartphone 800. The smartphone 800 may be implemented using a mobile computing device. The mobile computing device may be provided as one of an Ultra Mobile PC (UMPC), a digital picture player, a digital video recorder, a digital video player, a storage constituting a data center, a device capable of transmitting/receiving data in an wireless environment and various electronic devices constituting a home network, one of various electronic devices constituting a computer network, one of various electronic devices constituting a telematics network, a radio-frequency identification (RFID) device, or one of various constituents constituting a computing system.

An application processor, e.g., a mobile application processor 810 (AP) may control operations of components 815, 820, 841, and 850.

The mobile application processor 810 may use a mobile DRAM 815 as a working memory. A memory device 821 may be used as a working and program memory of a baseband processor 820.

A memory controller 811 (MC) implemented in the mobile application processor 810 may have the same connection configuration as shown in FIG. 1 to control an operation of accessing the mobile DRAM 815.

A display driver 813 implemented in the application processor 810 may control the operation of a display 850. The display may be implemented using a thin film transistor liquid crystal display (TFT-LCD), a light-emitting diode (LED) display, an organic LED (OLED) display, an active-matrix OLED (AMOLED) display or a flexible display.

A baseband processor 820 may interface data received/transmitted between a wireless transceiver 830 (RF) and the application processor 810. Data processed by the baseband processor 820 may be stored in the memory device 821 or transmitted to the application processor 810.

The memory device 821 may be implemented using a volatile memory or a nonvolatile memory. The volatile memory may be a dynamic random access memory (DRAM), a static random access memory (SRAM), a thyristor RAM (TRAM), a zero capacitor RAM (Z-RAM) or twin transistor RAM (TTRAM).

The nonvolatile memory may be an electrically erasable Programmable read only memory (EEPROM), a flash memory, a magnetic random access memory (MRAM), a spin-transfer torque MRAM, a conductive bridging RAM (CBRAM), a ferroelectric RAM (FeRAM), a phase change RAM (PRAM) which is also called an ovonic unified memory (OUM), a resistive RAM (RRAM or ReRAM), a nanotube RRAM, a polymer RAM (PoRAM), a nano floating gate memory (NFGM), a holographic memory, a molecular electronics memory device or an insulator resistance change memory. One or more bits may be stored in a unit cell of the nonvolatile memory.

Wireless data received through an antenna ANT is transmitted to the baseband processor through the wireless transceiver 830, and data output from the baseband processor 820 is converted to wireless data by the wireless transceiver 830. The converted wireless data is output through the antenna ANT.

An image signal processor 841 (ISP) may process a signal output from a camera (or image sensor 840) and transmit processed data to the application processor 810.

The application processor 810 may control the execution of web browsing, e-mail access, video playback, document editing, and image editing.

In FIG. 15, when a buffer circuit of the mobile DRAM 815 receives a data strobe signal in the form of a differential signal, an inverter latch for signal integrity of differential signaling is disabled during an unknown time interval of the data strobe signal. Thus, power consumption of a smartphone is minimized or reduced.

Figure 16:
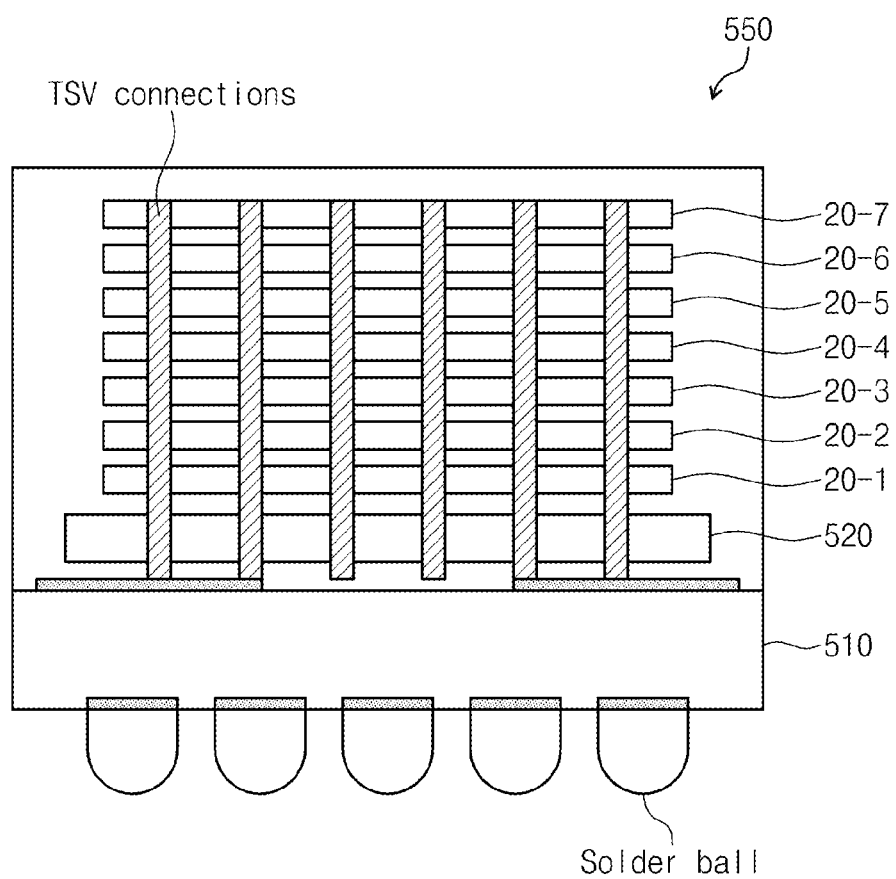
FIG. 16 illustrates an example of the application applied to a memory system stacked through a through-silicon via (TSV)

FIG. 16 illustrates an example of the application applied to a memory system 550 stacked through a through-silicon via (TSV) and including a plurality of solder balls. As illustrated, memory devices 20-1 to 20-7 may be stacked on a logic layer 520 in the memory system 550. The structure and operation of each of the memory devices 20-1 to 20-7 may be substantially identical to those of the above-described DRAM.

The memory devices 20-1 to 20-7 may be packaged by one of, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

A command, an address, and data between the components 20-1 to 20-7, 520, and a substrate 510 in FIG. 16 may be connected through vertical electric connection means, e.g., a through-silicon via (TSV).

Even in the case of FIG. 16, each memory device may be a mobile DRAM. The mobile DRAM may include a buffer circuit to receive differential input signals, as described with reference to FIG. 1. Since a latch controller may selectively switch off an inverter latch during an unknown time interval of a data strobe signal when a buffer circuit receives the data strobe signal in the form of a differential signal, power consumption may be minimized or reduced during the unknown time interval.

Although each memory device is implemented using a DRAM in FIG. 16, an MRAM may be mounted instead of the DRAM in other cases. Volatile memory devices such as SRAM or DRAM lose their stored data when their power supplies are interrupted.

Meanwhile, nonvolatile memory devices such as MRAM retain their stored data even when their power supplies are interrupted. Accordingly, nonvolatile memory devices are preferentially used to store data when data is not intended to be lost by a power failure or power-off.

When a spin transfer torque magneto resistive random access memory (STT-MRAM) constitutes a memory module, advantages of an MRAM may be added to the advantages of a DRAM.

An STT-MRAM cell may include a magnetic tunnel junction (MTJ) element and a selection transistor. The MTJ element may basically include a pinned layer, a free layer, and a tunnel layer disposed therebetween. A magnetization direction of the free layer is fixed and may be identical or opposite to that of the pinned layer.

Figure 17:
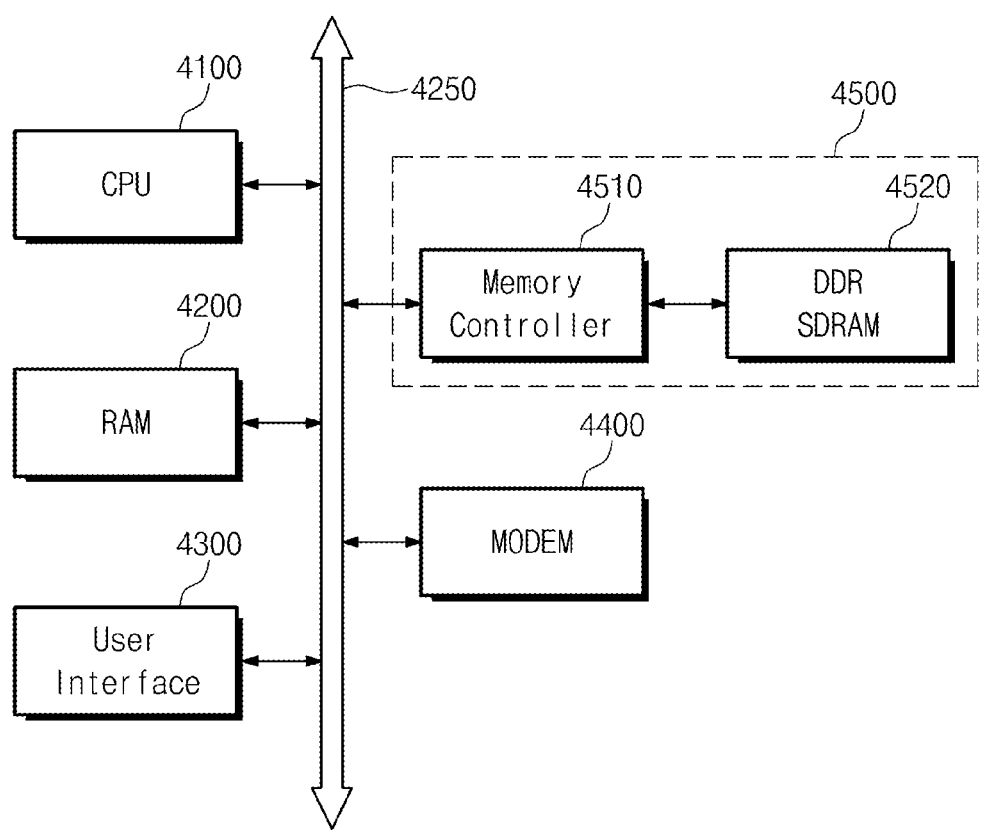
FIG. 17 is a block diagram illustrating an example of the application applied to a computing device.

FIG. 17 is a block diagram illustrating an example of the application applied to a computing device. As illustrated, the computing device may include a memory system 4500 including a DDRA SDRAM 4520 and a memory controller 4510. The computing device may include an information processing device or a computer. The computing device may further include a modem 4400, a central processing unit (CPU) 4100, a RAM 4200, and a user interface 4300 that are electrically connected to a system bus 4250. Data processed by the CPU 4100 or externally input data may be stored in the memory system 4500.

When the DRAM 4520 is a DDR4 DRAM, the DRAM 4520 may be manufactured with at least two dies in a mono package. Since the DDRA SDRAM 4520 may include a latch controller to control an inverter latch in a buffer circuit shown in FIG. 2 according to a phase comparison result of different input signals, power consumption of the computing device is reduced.

The computing device may be applied to a solid state disk (SSD), a camera image sensor, and other application chipsets. In some embodiments, the memory system 4500 may be configured using an SSD. In this case, the computing device may stably and reliably store large-capacity data in the memory system 4500.

The memory controller 4510 may apply a command, an address, data or another control signal to the DDR SDRAM 4520.

The CPU 4100 functions as a host and controls the overall operation of the computing device.

A host interface between the CPU 4100 and the memory controller 4150 may include various protocols for data exchange between a host and the memory controller 4500. In exemplary embodiments, memory controller 4510 may be configured to communicate with a host or an external device through one of various interface protocols such as USB (Universal Serial Bus) protocol, MMC (Multimedia Card) protocol, PCI (Peripheral Component Interconnection) protocol, PCI-E (PCI-Express) protocol, ATA (Advanced Technology Attachment) protocol, SATA (Serial ATA) protocol, ESDI (Enhanced Small Disk Interface) protocol, and IDE (Integrated Drive Electronics) protocol.

While the present disclosure has been particularly shown and described with reference to exemplary embodiments thereof, the general application is not limited to the above-described embodiments. It will be understood by those of ordinary skill in the art that various changes and variations in form and details may be made therein without departing from the spirit and scope of the application as defined by the following claims.

What is claimed is:

1. A semiconductor device comprising:
    a first input unit configured to buffer a first signal of differential input signals;
    a second input unit configured to buffer a second signal of the differential input signals;
    a latch coupled between a first repeating node of the first input unit and a second repeating node of the second input unit to prevent duty variation of the first and second signals; and
    a latch controller configured to selectively switch an operation of the latch based on states of the first and second signals appearing at the first and second repeating nodes during a time interval before preambles of the differential input signals are received.

2. The semiconductor device as set forth in claim 1, wherein a phase of the first signal and a phase of the second signal are opposite to each other.

3. The semiconductor device as set forth in claim 1, wherein the second signal is a complementary data strobe signal when the first signal is a data strobe signal.

4. The semiconductor device as set forth in claim 1, wherein:
    the first input unit comprises a first differential amplifying unit configured to perform differential amplification by receiving the first signal at a non-inverting terminal and receiving the second signal at an inverting terminal and a first inverting unit configured to lift a first buffering signal generated by the first differential amplifying unit to obtain a lifted first buffering signal, and output the lifted first buffering signal to the first repeating node, and
    the second input unit comprises a second differential amplifying unit configured to perform differential amplification by receiving the second signal at a non-inverting terminal and receiving the first signal at an inverting terminal and a second inverting unit configured to lift a second buffering signal generated by the second differential amplifying unit to obtain a lifted second buffering signal, and output the lifted second buffering signal to the second repeating node.

5. The semiconductor device as set forth in claim 1, wherein the latch is a cross-coupled inverter latch having an on/off switch terminal.

6. The semiconductor device as set forth in claim 5, wherein the latch controller switches off the latch to disable a latch operation when phases of the first and second signals are identical to each other.

7. The semiconductor device as set forth in claim 5, wherein the latch controller switches on the latch to enable a latch operation when phases of the first and second signals are different from each other.

8. The semiconductor device as set forth in claim 1, wherein the latch controller comprises:

a phase comparison unit configured to compare phases of the first and second signals appearing at the first and second repeating nodes; and a control signal generation unit configured to control a latch switching control signal in response to a result of the phase comparison.

9. The semiconductor device as set forth in claim 8, wherein the phase comparison unit comprises a plurality of inverters and NOR gates.

10. The semiconductor device as set forth in claim 1, which is a low-power double data rate DRAM.

11. A semiconductor device including a buffer circuit, wherein the buffer circuit comprises:

a first input unit configured to buffer a data strobe signal applied through a first pad;

a second input unit configured to buffer a complementary data strobe signal applied through a second pad;

a cross-coupled inverter latch coupled between a first repeating node of the first input unit and a second repeating node of the second input unit; and a latch controller configured to compare a phase of the data strobe signal appearing at the first repeating node with a phase of the complementary data strobe signal appearing at the second repeating node to generate a switching control signal for selectively switching an operation of the cross-coupled inverter latch.

12. The semiconductor device as set forth in claim 11, wherein the cross-coupled inverter latch is activated to a switch-on state after a preamble interval of the data strobe signal and the complementary strobe signal.

13. The semiconductor device as set forth in claim 11, wherein:

the first input unit comprises a first differential amplifying unit configured to perform differential amplification by receiving the data strobe signal at a non-inverting terminal and receiving the complementary data strobe signal at an inverting terminal and a first inverting unit configured to lift a first buffering signal generated by the first differential amplifying unit and to output the first buffering signal to the first repeating node, and the second input unit comprises a second differential amplifying unit configured to perform differential amplification by receiving the complementary data strobe signal at a non-inverting terminal and receiving the data strobe signal at an inverting terminal and a second inverting unit configured to lift a second buffering signal generated by the second differential amplifying unit and to output the second buffering signal to the second repeating node.

14. The semiconductor device as set forth in claim 11, wherein the cross-coupled inverter latch has an on/off switch terminal to receive the switching control signal.

15. The semiconductor device as set forth in claim 11, wherein the latch controller generates the switching control signal to switch off the cross-coupled inverter latch when phases of the data strobe signal and the complementary data strobe signal are identical to each other.

16. A semiconductor device comprising:

a latch that executes a duty cycle alignment operation in which duty cycles of first and second signals having opposite phases are aligned to obtain duty-cycle-aligned first and second signals;

a buffer that receives the duty-cycle-aligned first and second signals and generates first and second buffered signals, having opposite phases, from the duty-cycle-aligned first and second signals; and a latch controller that disables the duty cycle alignment operation of the latch while the first and second signals are devoid opposite phases from one another.

17. The semiconductor device of claim 16, wherein the first and second buffered signals are a differential pair of output signals.

18. The semiconductor device of claim 16, further comprising a differential amplifying device that receives received signals and generates the first and second signals from the received signals.

19. The semiconductor device of claim 16, further comprising another latch, wherein:

the buffer generates intermediary first and second signals, having opposite phases, from the duty-cycle-aligned first and second signals, the another latch executes another duty cycle alignment operation in which duty cycles of the first and second intermediary signals are aligned to obtain duty-cycle-aligned first and second intermediary signals, and the buffer generates the first and second buffered signals from the duty-cycle-aligned first and second intermediary signals.

20. The semiconductor device of claim 19, wherein the latch controller disables the another duty cycle alignment operation of the another latch while the first and second intermediary signals are devoid of opposite phases from one another.

* * * * *